(12) United States Patent
De Ambroggi et al.

(10) Patent No.: US 7,969,806 B2
(45) Date of Patent: Jun. 28, 2011

(54) SYSTEMS AND METHODS FOR WRITING TO A MEMORY

(75) Inventors: Luca De Ambroggi, Munich (DE); Jens Egerer, Kirchheim (DE); Peter Schroegmeier, Munich (DE)

(73) Assignee: Qimonda AG, Munich (DE)

( * ) Notice: Subject to any disclaimer, the term of this patent is extended or adjusted under 35 U.S.C. 154(b) by 477 days.

(21) Appl. No.: 12/110,859

(22) Filed: Apr. 28, 2008

(65) Prior Publication Data

US 2009/0268532 A1    Oct. 29, 2009

(51) Int. Cl.
*G11C 7/00* (2006.01)

(52) U.S. Cl. ............... 365/218; 365/185.29; 365/148; 365/230.01

(58) Field of Classification Search ............ 365/218, 365/185.29, 148, 158, 163, 171, 173
See application file for complete search history.

(56) References Cited

U.S. PATENT DOCUMENTS

| 5,805,520 | A | * | 9/1998 | Anglada et al. | 365/230.02 |
| 2005/0223186 | A1 | * | 10/2005 | Belevich et al. | 711/202 |
| 2006/0187701 | A1 | * | 8/2006 | Liaw | 365/148 |
| 2007/0183223 | A1 | * | 8/2007 | Aritome | 365/185.29 |

* cited by examiner

*Primary Examiner* — Vu A Le
*Assistant Examiner* — Han Yang
(74) *Attorney, Agent, or Firm* — Edell, Shapiro & Finnan, LLC

(57) ABSTRACT

An integrated circuit includes memory segments, each having at least one memory cell configurable in first and second states to store data, and a controller that controls programming and erasing of the memory segments. The controller maps external memory addresses of write data to internal memory addresses of erased memory segments with no memory cells in the first state such that erased memory segments are programmed with write data. When a write access occurs for an external memory address previously mapped to an internal memory address of a programmed memory segment with at least one memory cell in the first state, the controller remaps the external memory address to another internal memory address of an erased memory segment. The controller identifies programmed memory segments to be erased and controls selective erasure of the identified programmed memory segments, such as programmed memory segments no longer mapped to an external memory address.

13 Claims, 3 Drawing Sheets

SYSTEMS AND METHODS FOR WRITING TO A MEMORY

BACKGROUND

Many electronic devices and systems have the capability to store and retrieve information in a memory. Internally, a memory controller typically coordinates access to one or more memory devices which store the information. Several different memory families (e.g., DRAMs, pseudo-SRAM, NOR-flash, NAND-flash, etc.) are currently used for memory devices in such systems. Memory devices based on emerging technologies may be suitable as replacements for such current types of memory devices. In order to substitute newer types of memory devices for these current types of memory devices, the read and write performance of the substituted memories has to be met by the replacement memories. For example, to use a non-volatile memory device as a drop-in replacement for a DRAM in an electronic device without modifying others aspects of the electronic device, the substitute memory device must roughly match the read/write access speed of the DRAM (e.g., on the order of about 5 ns).

Resistive memory technologies, for instance, offer the significant advantages of non-volatility and fast read access but in some cases require longer time periods to write information into the memory material. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. Typically, the resistance value of the memory element is switched electrically by applying a voltage pulse or a current pulse to the memory element.

Phase change memory is one type of resistive memory which uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. In a phase change random access memory (PCRAM), a phase change memory cell can be "reset" to a high-resistance amorphous state by heating the phase change material and then quenching the material. To "set" the phase change memory cell to a lower-resistance crystalline state, the material is heated and then slowly cooled down. The reset operation may require about 10 ns to complete, which is roughly in the range of the DRAM write speed. However, the set operation may require about 50 ns to 200 ns, depending on the phase change material, which is much longer than a typical DRAM write operation.

It would be desirable to take advantage of the benefits of emerging memory technologies while still approaching the write speeds expected of current memory technologies. Such capabilities would allow memory devices based on emerging memory technologies to be readily substituted for memory devices that employ current memory technologies such as DRAM and flash memories.

SUMMARY

An integrated circuit includes a memory device with a plurality of memory segments and a controller. The memory segments, for example, comprise at least one memory cell that requires less time to be reset in a first state than to be set in a second state, wherein an erased memory segment includes no memory cells in the first state and a programmed memory segment includes at least one memory cell in the first state.

The controller controls programming and erasing of memory segments and maps external memory addresses of write data to internal memory addresses of erased memory segments such that erased memory segments are programmed with write data. The controller also identifies programmed memory segments to be erased and controls selective erasure of the identified programmed memory segments. For example, when a write access occurs for an external memory address previously mapped to a first internal memory address of a programmed memory segment, the controller remaps the external memory address to a second internal memory address of an erased memory segment and identifies for erasure the programmed memory segment associated with the de-mapped first internal memory address.

In this manner, only the faster resetting operation needs to be performed at the time of a write access, and the slower setting operation which occurs at the time of erasure can be performed in a less time-critical manner, for example during periods of inactivity of the memory device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

According to an aspect of the invention, a memory whose cells require a greater time to "set" in one logical state than to "reset" in another logical state is written to in a manner that avoids the longer writing time associated with the slower "set" operation. Write operations are performed such that memory segments being written to initially have all memory cells in the set state (e.g., the crystalline state in the case of a phase change memory). As a result, at the time of a write access, only the faster reset operations need to be performed to program the memory segment with data to be stored. In the case of a phase change random access memory (PCRAM), for example, the write time for the reset operation (i.e., the amorphous state) is in the range of 10 ns, which is close to current DRAM performance. This approach permits devices based on emerging memory technologies to be substituted for conventional types of memories such as DRAM and flash memories without modifying the specifications or operating requirements of a host device in which the memory is used.

The concepts of the invention will be described in greater detail in the context of illustrative, non-limiting embodiments with reference to the accompanying drawings. Because components of embodiments can be positioned in a number of different orientations, any directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various embodiments described herein may be combined with each other, unless specifically noted otherwise.

Figure 1:
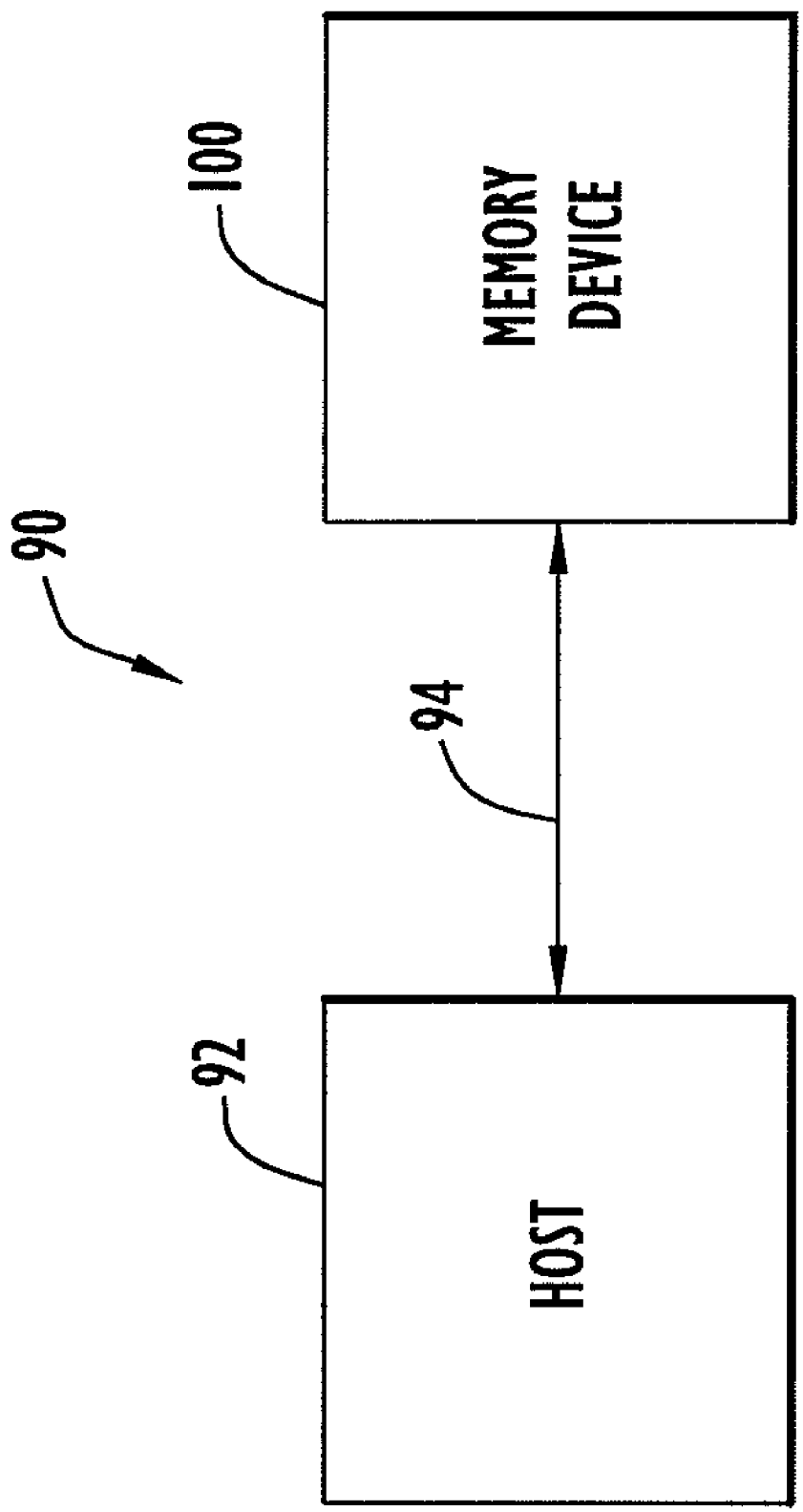
FIG. 1 is a block diagram illustrating an embodiment of a system including a memory device.

FIG. 1 is a block diagram illustrating an embodiment of a system 90 that includes a host 92 and a memory device 100. Host 92 is communicatively coupled to memory device 100 through communication link 94 (e.g., one or more busses). Host 92 can be any of a wide variety of devices including but not limited to a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92 and may constitute all or part of an integrated circuit. For example, memory device 100 may represent a memory chip accessed by a processor of host 92. Memory device 100 could also be a memory module, such as a dual in-line memory module (DIMM) card, that includes a plurality of memory chips controlled by a memory controller. In general, memory device 100 is not limited to any particular architecture or application, and can be configured to suit the requirements of host device 92.

Figure 2:
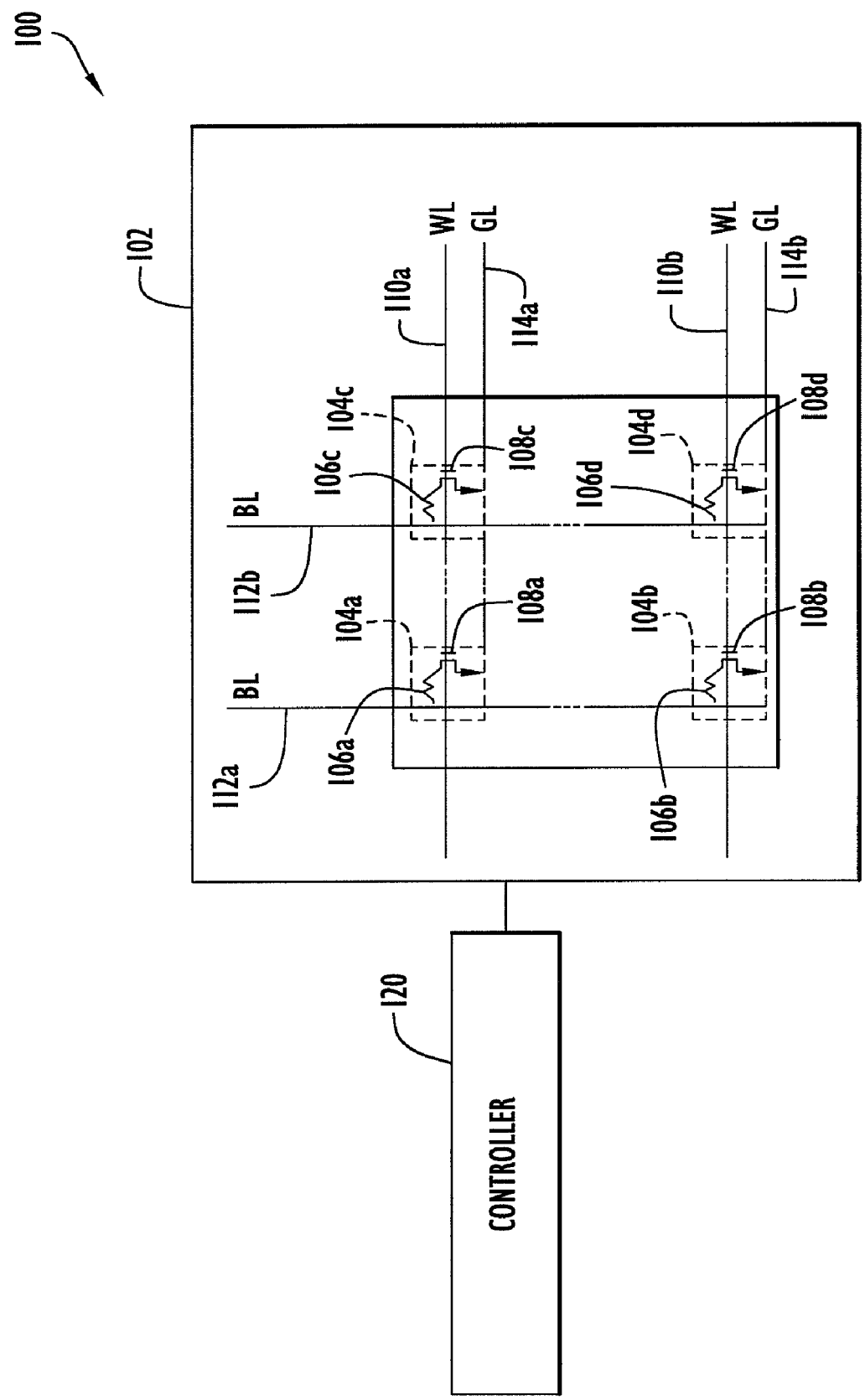
FIG. 2 is a conceptual block diagram illustrating an embodiment of a memory device.

FIG. 2 is a diagram illustrating an embodiment of memory device 100. Memory device 100 includes a controller 120 and a memory array 102. Controller 120 may be resident on a same memory chip as memory array 102 or may be external to a memory chip containing memory array 102. Memory array 102 includes a plurality of memory cells each of which is capable of being configured in at least two states which represent information (e.g., first logical state that represents a binary "1" and a second logical state that represents a binary "0").

While the invention is not limited to any particular type of memory technology, the memory writing scheme employed by the invention is particularly useful in the context of memory devices in which the amount of time required to write data of one logical state to a memory cell is significantly longer than the amount of time required to write data of another logical state to a memory cell. At least some types of resistivity changing memory devices, such as phase change random access memory (PCRAM) devices, exhibit this characteristic. For purposes of illustration, the memory cells shown in FIG. 2 are configured as resistivity changing memory cells, such as those of a resistive random access memory device.

As shown in FIG. 2, memory array 102 includes a plurality of resistivity changing memory cells 104a-104d (collectively referred to as resistive memory cells 104), a plurality of bit lines (BLs) 112a-112b (collectively referred to as bit lines 112), a plurality of word lines (WLs) 110a-110b (collectively referred to as word lines 110), and a plurality of ground lines (GLs) 114a-114b (collectively referred to as ground lines 114). The ground lines are only a feature of a particular embodiment and are not required for the invention. In one embodiment, resistivity changing memory cells 104 are phase change memory cells. In other embodiments, resistivity changing memory cells 104 can be other suitable types of resistivity changing memory cells, such as magnetic memory cells.

As used herein, the term "electrically coupled" is not meant to require that the elements must be directly coupled together and intervening elements may be provided between the "electrically coupled" elements. Each memory cell 104 is electrically coupled to a word line 110, a bit line 112, and a ground line 114. For example, memory cell 104a is electrically coupled to bit line 112a, word line 110a, and ground line 114a, and memory cell 104b is electrically coupled to bit line 112a, word line 110b, and ground line 114b. Memory cell 104c is electrically coupled to bit line 112b, word line 110a, and ground line 114a, and memory cell 104d is electrically coupled to bit line 112b, word line 110b, and ground line 114b.

Each memory cell 104 includes a resistivity changing memory storage element 106 and a select device 108, e.g., a transistor or diode. For example, memory cell 104a includes a storage element 106a and select device 108a. One side of storage element 106a is electrically coupled to bit line 112a and the other side of storage element 106a is electrically coupled to one side of the source-drain path of select device 108a. The other side of the source-drain path of select device 108a is electrically coupled to ground line 114a. The gate of transistor 108a is electrically coupled to word line 110a. Memory cells 104b-104d include similarly arranged storage elements 106c-106d and select devices 108c-108d. While select device 108 is shown as a field-effect transistor (FET) in the illustrated embodiment, the select device 108 can be other suitable devices such as a bipolar transistor or a 3D transistor structure. In other embodiments, a diode-like structure may be used in place of a transistor. In this case, a diode and storage element 106 is coupled in series between each cross point of word lines 110 and bit lines 112.

Controller 120 includes a microprocessor, microcontroller, finite state machine, or other suitable logic circuitry for controlling the operation of memory device 100. In general controller 120 can be implemented in any combination of hardware and/or software and is not limited to any particular architecture. Controller 120 controls read and write operations of memory device 100 including the application of control and data signals to memory array 102 through a write circuit and a sense circuit (not shown), for example. A write circuit under control of controller 120 can provide voltage or current pulses through bit lines 112 to memory cells 104 to program the memory cells.

A sense circuit (not shown) can read the states of memory cells 104 through bit lines 112. For example, to read the resistance of one of the memory cells 104, the sense circuit or write circuit provides voltage across the memory cell or current that flows through the memory cell, and then the sense circuit reads the current that flows through the memory cell or the voltage across the memory cell to determine the resistance level and the logical state of the memory cell.

By way of a non-limiting example, the resistivity changing storage elements 106 of memory cells 104 can be phase change storage elements that comprises a phase change material that may be made up of a variety of materials. Generally, chalcogenide alloys that contain one or more elements from Group VI of the periodic table are useful as such materials. In an embodiment, the phase change material is made up of a chalcogenide compound material, such as GeSbTe, SbTe, GeTe, or AgInSbTe. In one embodiment, the phase change material is chalcogen free, such as GeSb, GaSb, InSb, or GeGaInSb. In other embodiments, the phase change material can be made up of any suitable material including one or more of the elements Ge, Sb, Te, Ga, As, In, Se, and S. Other resistivity changing materials that can be used include a resistive thin film of a resistance-reversible material such as colossal magnet resistive thin film (e.g., PCMO thin film ($Pr_{0.7}Cr_{0.3}MoO_3$)), oxidation films having Perovskite structure (e.g., $Nb_2O_5$, $TiO_2$, $TaO_5$, NiO), or oxidation film such as $SrTiO_3$:Cr. However, it will be appreciated that the invention is not limited to any particular material or classes of materials, and virtually any substance capable of being configured in plural resistance states can be employed. While the examples of resistivity changing materials are described above, as used herein, the terms "memory cell" and "storage element" are not limited to any particular technologies or materials, and may include, for example, any type of memory cell or storage element in which a write process for one state is more time consuming than for another state.

According to one embodiment involving a storage element comprising a phase change material, each phase change memory element may be changed from an amorphous state to a crystalline state or from a crystalline state to an amorphous state under the influence of temperature change. The amount of crystalline material coexisting with amorphous material in the phase change material of one of the phase change memory elements thereby defines two or more states for storing data within memory device 100. In the amorphous state, a phase change material exhibits significantly higher resistivity than in the crystalline state. Therefore, the two or more states of the phase change memory elements differ in their electrical resistivity.

Phase changes in the phase change materials may be induced reversibly. In this way, the storage element may change from the amorphous state to the crystalline state and from the crystalline state to the amorphous state in response to temperature changes. The temperature changes of the phase change material may be achieved by driving current through the phase change material itself or by driving current through a resistive heater adjacent to the phase change material. With both of these methods, controllable heating of the phase change material causes controllable phase change within the phase change material.

A phase change memory can include a memory array having a plurality of memory cells that are made of phase change material and are programmable to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

During a "set" operation of a phase change memory cell 104, a set current or voltage pulse is selectively enabled via a write circuit and sent through a bit line 112 to phase change memory element 106, thereby heating phase change memory element 106 above its crystallization temperature (but usually below its melting temperature). In this way, phase change memory element 106 reaches its crystalline state or a partially crystalline and partially amorphous state during this set operation. This crystalline state possesses a lower resistance which can represent storage of a logical "0." The assignment of logical states "0" and "1" to the low resistance (crystalline) and high resistance (amorphous) states is arbitrary and could be assigned oppositely.

During a "reset" operation of phase change memory cell 104, a reset current or voltage pulse is selectively enabled by the write circuit and sent through a bit line 112 to phase change memory element 106. The reset current or voltage quickly heats phase change memory element 106 above its melting temperature. After the current or voltage pulse is turned off, phase change memory element 106 quickly quench cools into the amorphous state or a partially amorphous and partially crystalline state. In other embodiments, for other types of resistive memory cells, the write circuit provides suitable programming pulses to program the resistivity changing memory cells 104 to the desired state (e.g., a magnetic memory device or conductive bridge memory device).

As previously noted, depending on the particular type of memory cell and the phase change material of the storage element, the amount of time required to "set" the memory cell in a low resistance crystalline state may be significantly longer than the amount of time required to "reset" the memory cell in the high-resistance amorphous state. If a write access operation calls for one or more memory cells to be set in order to store a "0", the speed of the write access operation will be limited by the time required to perform the set operation.

According to an aspect of the invention, the controller ensures that data being written to the memory array is written to segments of memory cells that are erased in advance, so that only reset operations are required to store the data in response to a write access operation. As used herein, the term "data" refers to any information that can be represented digitally. As used herein, the term "memory segment" refers to one or more memory cells that are addressable as a unit in response to a write access instruction, request, or command for storing data. A memory segment is in an erased stated (or "erased") when each of the memory cells in the memory segment have been set in one state, for example, a low-resistance state. A memory segment is in a programmed state (or "programmed") when at least one memory cell in the segment has been reset in another state, for example, a high-resistance state. The memory cells of a memory segment do not need to be physically contiguous.

The size of a memory segment may depend on the architecture of the memory device, the requirements of the host device, the application being run, or other factors. For example, a memory segment can be a single, addressable memory cell, where programming and erasing can be performed on a bit-by-bit basis. A memory segment can also be some number of bytes that are addressable via a write access command. For example a memory segment can correspond to a word or group of words, or may even be an entire memory page or plural pages. The size of memory segments may be programmable to allow use of the memory device in different host devices or with different applications. Optionally, the memory segment size can be adjustable on the fly or via a command or more than one memory segment size can be used simultaneously within the memory device (e.g., controlled via different types of write commands or by address). By way of a non-limiting example, if a memory chip containing a controller and memory array configured in accordance with the described embodiment is to be used as a drop-in replacement for a DRAM memory device, the memory segments may be on the order of the size of a data word. On the other hand, when used as a replacement for a flash memory, the size of a memory segment could be significantly larger, on the order of a page or plural pages.

According to another aspect of the invention, the controller identifies, marks, or keeps track of programmed memory segments that require erasure, and controls selective erasure of those programmed memory segments identified as needing to be erased. As described in greater detail below, once a memory segment has been written to, in general, it cannot be written to again until it is erased (unless for example the subsequent writing would not change any memory cells from a logical "1" state to a logical "0" state). Consequently, instead of overwriting programmed data with new data associated with the same external address, a different, erased memory segment is programmed with the new data. In this case, the original memory segment is still programmed but is no longer being used. The controller identifies this programmed memory segment as one to be erased. When an erase operation occurs, the controller selectively erases the memory segments which have been identified in this manner. Memory segments not identified for erasure need not be erased during an erase operation.

According to one possible implementation, programming and erasing of memory cells can be performed at the memory segment level, such that programming and erasing operations are carried out on segments of memory cells of the same size. For example, if a write access command stores a data word by programming a segment of memory cells corresponding the number of bits in a word, then erasing of memory cells is also performed independently at the level of word-sized memory segments. Likewise, if individual bits are programmed independently, then individual bits can be erased independently. As used herein, the term "same memory granularity" refers to the principle that programming and erasing operations are performed on segments of memory cells of the same size. In other words, the granularity of the programming operations in terms of the number of memory cells being programmed at once is the same as the granularity of the erasing operations. However, in general, the invention is not limited to performing erasure of memory segments at the same memory density as programming. Thus, for example, any number of memory segments previously identified or marked for erasure can be erased during an erasing operation, whether individually through separate commands or jointly with a single command.

In certain types of flash memories, the erase time is much longer than the programming time. Such flash memories typically compensate for the slow erase speed by erasing large segments of memory cells simultaneously. A distinction between conventional flash memories and the memories of the present invention is that in flash memories erase operations are typically performed on large blocks of memory cells without determining whether individual segments or sub-blocks within a large block were previously programmed and actually require erasure. That is, the erasing process is not selective to only those segments or sub-blocks that have been identified as needing erasure. For example, in a NOR flash memory, it may be possible to program 16 or 32 bits at time from a write command; however, erasing is simultaneously performed on a much greater number of bits (i.e., a NOR flash cannot selectively identify those 16 or 32 bits for erasing but can erase those bits only by erasing an entire page or multiple pages at once). The very slow setting times of flash memories make it impractical to keep track of which memory cells require erasure and to selectively erase only those memory cells (or segments) that are identified as requiring erasure. With a resistive memory device such as a phase change memory device, the setting time may be longer than the resetting time; however, the setting time is not as long as that of a flash memory, making selective erasure feasible with a resistive memory device. According to this aspect of the invention, within a larger block of memory cells, certain segments can be erased and then reprogrammed while other segments can remain programmed and undisturbed during erasure of certain segments within the block. Within a block of memory cells, the segments that are affected by an erasure operation can be interspersed with other programmed or erased segments that are not affected by the selective erasure operation. Such a selective identification and erasing scheme is not feasible in conventional flash memory devices.

Referring again to FIG. 2, controller 120 is responsible for keeping track of which memory locations are programmed with data (which was received along with a write command and written to the memory) and which memory locations are erased and therefore available for storing newly received write data. By maintaining a mapping between external memory addresses associated with write data to be stored in the memory array and internal memory addresses of memory segments programmed with the write data, controller 120 can efficiently program and erase memory segments to store data.

Figure 3:
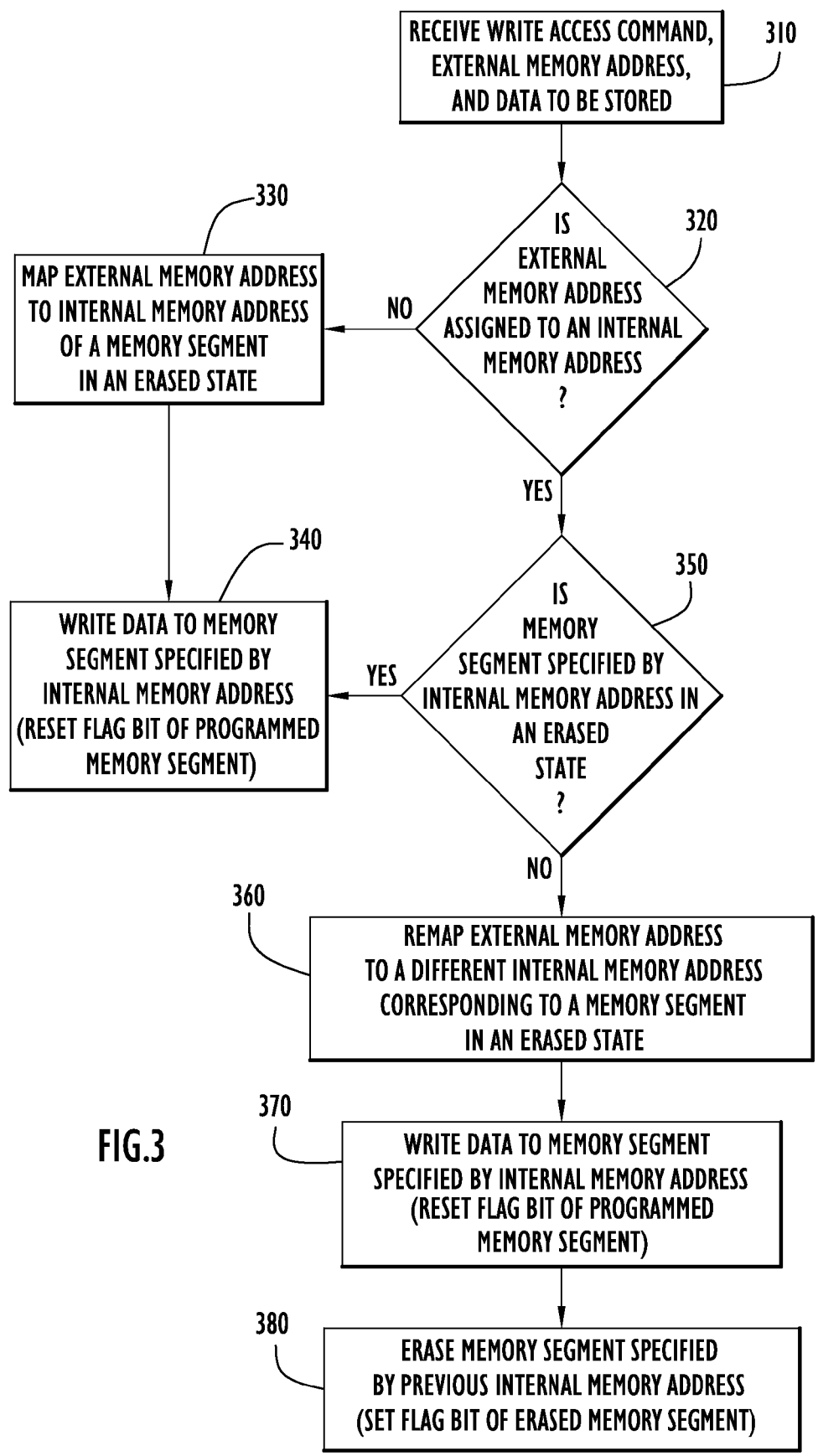
FIG. 3 is a flow diagram illustrating mapping and remapping of external memory addresses to internal memory addresses according to an embodiment of the invention.

A conceptual flow diagram of operation of the controller is shown in FIG. 3. Typically, a write access operation involves the controller receiving a write access command or instruction originating from the host device, together with an associated memory address and the write data to be stored (operation 310 in FIG. 3). This memory address is designated here as the "external memory address" since it is the memory address associated with the data by any device or circuit external to the controller and memory array. The external memory address can be used, for example, to access the stored data via a read operation or to replace the stored data with new data via a subsequent write operation. The external write command, the address, and the write data can be received in any format, e.g., in parallel over separate busses or serially over a common bus.

According to the described embodiment, it is desirable to write to memory segments that are erased (i.e., segments in which all cells are set in the state that requires a longer writing time). To keep track of which internal memory addresses are associated with erased memory segments and which are associated with programmed memory segments, an additional flag bit can be provided with each memory segment (or its internal memory address) to indicate whether the memory segment is erased or programmed. For example, the flag bit can be put in the set state to indicate that its memory segment is in an erased state (completely set), and the flag bit can be put in the reset state to indicate that its memory segment is in the programmed state (at least one memory cell of the segment is reset). The flag bits can be stored in memory cells within the memory cell array. For example, an additional memory cell can be provided within each memory segment for use as the flag bit. According to another option, a separate portion of the memory array can comprise a group of memory cells used as flag bits. According to yet another option, the flag bits can be stored in the controller itself. While use of flag bits is a convenient mechanism to keep track of which memory segments are programmed and erased, the use of flag bits within the memory cell array or controller is optional. According to another approach, the controller can check the state (set/reset) of the memory cells in a memory segment to determine whether the memory segment is programmed or erased. Another option would be for the controller to keep track of the erased memory segments and the memory segments to be erased by using two stacks.

In operation 320 shown in FIG. 3, the controller determines whether the received external memory address is assigned to an internal memory address of the memory device. Internal memory addresses are memory addresses that the controller associates with memory segments within the memory array. The controller maintains a mapping of external memory addresses to internal memory addresses in order to access the appropriate memory cells in response to a read or write operation. If the external memory address received by the controller is not yet assigned to an internal memory address, the controller maps the external memory address to an internal memory address of a memory segment that is in an erased state (operation 330). In the case of phase change memory cells, for example, the memory segment is in the erased state when all of the memory cells are set in a more crystalline, lower-resistance state. The initial mapping of an external memory addresses to an internal memory address can be performed in response to the initial receipt of the external memory address with a write access command, as suggested by FIG. 3. Another option is to pre-map at least some expected external memory addresses to internal memory addresses of erased memory segments.

The controller maps the external memory address to an internal memory address by identifying an internal memory address of an erased memory segment (e.g., by evaluating its flag bit) and assigning the external memory address to the internal memory address. The mapping of external-to-internal addresses can be maintained in a table or link list stored in the controller or memory array, for example.

Once the external memory address associated with a received write access command is mapped to the internal memory address of an erased memory segment, in operation 340, the data to be stored is written to the memory segment specified by the internal memory address by resetting the appropriate memory cells within the segment. For example, to write the binary bits "01001100," the appropriate three memory cells within a segment of eight memory cells are reset to a logical "1" state (e.g., a high-resistance amorphous state in the case of a phase change memory cell), while the remaining five memory cells remain unchanged in the logical "0" state. As previously explained, by writing to memory segments that are erased, only the faster reset operation needs to be performed at the time of a write operation, since the default state of each memory cell in the erased segment is the state that requires the longer writing time.

In the event that writing the data to the memory segment results in at least one memory cell being reset to a different logical state (e.g., a high-resistance amorphous state), the memory segment is considered "programmed." If a flag bit is employed, the flag bit associated with the programmed memory segment is reset to indicate that the memory segment is in the programmed state.

Once the flag bit of a memory segment has been reset to a state indicating that the memory segment is programmed, the controller will not attempt to write data to the memory segment again, until the memory segment has subsequently been erased and the flag bit has been set. Referring again to FIG. 3, if a write command is received with an external memory address previously assigned to an internal memory address, in operation 350, the controller determines (e.g., by examining the flag bit) whether the memory segment specified by the internal memory address is in an erased stated or a programmed state. If the memory segment of the earlier mapped internal memory address is in an erased state (this might be the case, for example, if a previous write operation involved writing only logical zeros to the memory segment), operation 340 is performed as described above, with the data associated with the current write command being written to the memory segment and the flag bit being reset to indicate a programmed state if at least one memory cell is reset via the write operation.

If, however, upon evaluating the flag bit, the controller determines that the external memory address associated with a write access command has been mapped to an internal memory address of a programmed memory segment (e.g., as a result of earlier writing data with the same external memory address), the controller does not write the data to the memory segment of the currently mapped internal memory address. Rather, in operation 360, the controller remaps the external memory address to a different internal memory address corresponding to a memory segment in an erased state. Here again, the controller can identify an erased memory segment by evaluating the state of the flag bit of the memory segment. The data to be stored by the write operation is then written to the memory segment specified by the internal memory address newly mapped to the external memory address by resetting the appropriate memory cells within the segment (operation 370). Once programmed in this manner, the flag bit associated with the new memory segment is reset to indicate that the memory segment is programmed, if at least one bit in the segment is programmed with a "1" bit. Thus, in general, when an external memory address is "written to" a second time and subsequent times, the controller performs a remapping of the external memory address to a new internal memory address of an erased memory segment such that the data is written to an erased memory segment each time. The decision of whether or not to remap an external memory address can be made either by evaluating the flag bit, or by reading data currently stored at the internal memory address to determine whether all the bits are in the set state (i.e., the segment is in an erased state). According to another approach, rather than examining a flag bit or examining the bits of a memory segment to determine if a remapping is necessary, the current contents of the memory segment can be read and compared to the data to be store, and only if there is a difference between the write data and the stored data is a remapping performed. Optionally, remapping can also be avoided if storing the write data would involve only logical "0" bits changing to logical "1" bits (no instances of logical "1" bits changing to logical "0" bits).

Each time a remapping of an external memory address to a new internal memory address occurs, the internal memory address previously mapped to the external memory address effectively becomes de-mapped and is no longer in use. However, before reusing the de-mapped internal memory address, the associated programmed memory segment must be erased. Thus, a memory segment that is programmed but is no longer mapped to an external memory address is identified by the controller as requiring erasure. Accordingly, in operation 380, the controller controls erasing of the memory segment specified by the previous internal memory address which is now de-mapped. Erasing is performed by ensuring that each memory cell in the segment is set in the logical state that requires the longer write time. For example, in the case of phase change memory cells, each memory cell that was reset to a high-resistance amorphous state (logical "1") during a previous writing operation is set back to a lower-resistance crystalline state (logical "0") by the slower setting process. Optionally, every memory cell in the memory segment can be set in the erasure process, regardless of the state of individual cells. According to another approach, those memory cells that had remained in logical "0" state are not subject to a setting operation during the erasure process and only those memory cells that had been reset to the logical "1" state by the earlier writing operation are set back to the logical "0" state during the erasure process. In either case, the result is that the memory segment is returned to an erased state with all of the memory cells in the same logical state, i.e., the logical state that requires a longer writing time to achieve. The flag bit associated with the memory segment being erased can be set along with the memory cells to indicate to the controller that the memory segment is in the erased state and ready to be mapped via an internal memory address to an external memory address of a subsequent write command.

Since the erasing process involves the longer "set" operation to be performed on memory cells, the erasing process requires a longer time than the programming process, and it may not be possible to carry out the erasing process at the time of the write access (or immediately subsequent to the write access) which led to the de-mapping of a memory segment to be erased. For example, another write operation or a read operation may be scheduled immediately after a write operation involving re-mapping, such that access to the memory array is required and an erasing process cannot be performed simultaneously during these subsequent accesses. In accordance with an aspect of the invention, the controller can be configured to schedule erasing of de-mapped memory segments during periods in which the memory array is inactive (e.g., in periods in which read and write accesses cannot occur or are unlikely to occur). For example, if a memory device according to an embodiment of the invention is used as a drop-in replacement for a DRAM memory device, the host device would typically be configured to assume that the memory device requires periodic refresh operations to be performed within the memory device. If the host device is operating the replacement memory device under such an assumption (e.g., using an external refresh cycle), the replacement memory device can schedule erasing of memory segments during the refresh period in which the host will not send any access requests to the memory device. Likewise, erasing of de-mapped memory segments can be scheduled during periods in which the memory device is in an idle state or a "sleep" state, during power-up or power-down, during charging, or during any other period of inactivity in which access to the memory array is not required in a way that would result in interference from an erasing process. As used herein, the term "periods of inactivity" refer to periods of time in which the memory array is available for maintenance tasks that can be performed without interfering with operations of the memory device required by the host or external system. Thus, for example, an external refresh cycle or a sleep mode would typically be a period of inactivity (or idle parts of a memory array, e.g., a DRAM bank not activated), whereas periods in which read and write accesses are performed would not be periods of inactivity if erasing operations would interfere with such memory accesses.

Note that, as a result of the scheme of programming and erasing memory segments in conjunction with the mapping, re-mapping, and de-mapping of internal memory addresses, each re-mapping operation results in the programming of an erased memory segment and the eventual erasing of a programmed memory segment of a corresponding size. In other words, each remapping and programming of a new segment results in a previous segment of a comparable size being de-mapped and erased.

In applications in which frequent read and/or write accesses are required over a period of time, particularly with small memory segments, it is possible that all available erased memory segments are used before there is an opportunity to erase de-mapped memory segments for subsequent reuse (i.e., the write frequency is too high for the controller to keep up with erasing of memory segments). To account for the possibility of this overflow situation, the memory architecture can include an additional "hidden" memory to work around the problem. For example, a memory chip of a specified size may include additional memory beyond the specified memory size, which can be used as buffer to allow the controller additional time to complete erasure of de-mapped memory segments. The controller can coordinate temporary writing of data to the additional memory buffer, and then schedule re-writing of data to the primary memory array once a sufficient number of memory segments have been erased. A memory array larger than the external address space could also be used to enable write operations when all memory segments are in the "programmed" or "to be erased" states.

Referring again to FIG. 3, another scenario in which the process can flow from operation 350 to operation 340 is where the external memory address was previously assigned to an internal memory address whose memory segment was programmed, but prior to receipt of a next write command to that external memory address, the memory segment was erased due to an operation other than remapping. For example, the memory device could be used in a manner in which memory locations are written to sequentially rather than randomly, wherein data is written to the memory in a predictable, orderly manner. In this case, an external host device could inform the memory device via a signal or command when certain data is no longer useful or valid, which allows the controller to erase the memory segments containing that data in advance of receiving new data to be stored at the addresses of the "old" data. In certain applications, stored data may become unusable after a certain period of time has elapsed, and the controller can be configured to automatically erase memory segment after a predetermined time has elapsed since the data was programmed, such that the memory segments are prepared to store new data upon its available without remapping the external memory address. These are examples of scenarios in which the controller identifies certain memory segments for erasure without a remapping occurring for second and subsequent write access operations to external memory addresses that have previously been mapped to internal memory addresses.

The foregoing examples involve binary memory cells in which the storage element can be placed in one of two states which respectively represent a logical "0" and "1." However, the concepts of the invention can be applied to memory devices having multi-level memory cells capable of being placed in more than two states and storing multiple bits of data. For example, multi-bit storage in a phase change memory cell can be achieved by programming the phase change material to have intermediate resistance values or states, where the multi-bit or multilevel phase change memory cell can be written to more than two states. Some phase change materials exhibit multiple crystalline states, e.g., a face-centered cubic (FCC) state and a hexagonal closest packing (HCP) state, which have different resistivities and may be used to store bits of data. To program a phase change memory cell to an intermediate resistance value, the amount of crystalline material coexisting with amorphous material and hence the cell resistance is controlled via a suitable write strategy. The re-mapping and erasing scheme described above would be particularly suitable in a multi-level memory cell where the "set" mechanism that has the slower writing speed is used for writing one of the levels and different degrees of types of the faster "reset" operation are used for writing the remaining levels.

According to the invention, the practical write speed requirements that the memory device can meet are limited only by the faster write speed associated with writing one logical state and not the slower writing speed associated with writing another logical state. This feature permits a memory device based on newer technologies such as resistive memory to be used as a drop-in replacement for one of today's memory platforms (e.g., DRAM or flash) even though the memory device has one memory state that requires a significantly longer write time. In at least certain applications, the re-mapping feature of the invention also tends to achieve a more equal usage of memory locations of the memory array, since read and write accesses to a frequently-used external memory address result in read and write accesses to different memory segments within the memory array over time.

While the specific embodiments described herein are substantially focused on using resistive memory elements or phase change memory elements, the present invention can be applied to any suitable type of memory elements and memory devices, particular those in which the speed of writing to memory cells to one logical state is slower than another logical state.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
a plurality of memory segments each comprising at least one memory cell that is configurable in at least first and second states to store data, wherein an erased memory segment includes no memory cells in the first state and a programmed memory segment includes at least one memory cell in the first state; and
a controller configured to control programming and erasing of memory segments, wherein the controller is configured to:
map an external memory address of write data to an internal memory address of an erased memory segment such that the erased memory segment is programmed with the write data;
remap the external memory address to a second internal memory address of an erased memory segment in response to a write access for an external memory address previously mapped to a first internal memory address of a programmed memory segment; and
identify for erasure the programmed memory segment associated with the first internal memory address and control selective erasure of the identified programmed memory segment.

2. An integrated circuit, comprising:
a plurality of memory segments each comprising at least one memory cell that is configurable in at least first and second states to store data, wherein an erased memory segment includes no memory cells in the first state and a programmed memory segment includes at least one memory cell in the first state; and
a controller configured to control programming and erasing of memory segments, wherein the controller is configured to:
map an external memory address of first data to an internal memory address of a first memory segment that is erased such that the first memory segment is programmed with the first data; and
identify the first memory segment for erasure in response to an external signal or after a period of time has elapsed since programming, the controller being configured to control programming of the first memory segment with second data subsequent to erasure of the first memory segment without remapping the external memory address.

3. The integrated circuit of claim 1, wherein the at least one memory cell includes a storage element that requires less time to be reset in the first state than to be set in the second state.

4. The integrated circuit of claim 3, wherein the storage element comprises a resistivity changing material.

5. The integrated circuit of claim 3, wherein the storage element is configurable in at least three states to store more than two bits.

6. The integrated circuit of claim 3, wherein the integrated circuit comprises at least one of: a phase change random access memory (PCRAM) device; a conductive bridge random access memory (CBRAM) device; and a magnetic random access memory (MRAM) device.

7. The integrated circuit of claim 1, wherein the memory segments are disposed on at least one chip and the controller is external to the chip.

8. An integrated circuit, comprising:
a plurality of memory segments each comprising at least one memory cell that is configurable in at least first and second states to store data, wherein an erased memory segment includes no memory cells in the first state and a programmed memory segment includes at least one memory cell in the first state, wherein each memory segment is associated with a flag bit having a first state that indicates the memory segment is erased and a second state that indicates the memory segment is programmed; and
a controller configured to control programming and erasing of memory segments, wherein the control is configured to: determine whether to map or remap an external memory address to an internal memory address of a memory segment based on the state of the flag bit of the memory segment; and identify programmed memory segments to be erased and control selective erasure of the identified programmed memory segments by erasing a memory segment that is not mapped to an external memory address but whose flag bit is in the second state.

9. The integrated circuit of claim 1, wherein the controller is configured to schedule erasing of programmed memory segments no longer mapped to an external memory address during periods of inactivity.

10. The integrated circuit of claim 1, further comprising:
an overflow memory for temporarily storing data in response to an insufficient number of erased memory segments for storing write data.

11. A system, comprising:
a host; and
a memory device communicatively coupled to the host, the memory device comprising:
a plurality of memory segments each comprising at least one memory cell that is configurable in at least first and second states to store data, wherein an erased memory segment includes no memory cells in the first state and a programmed memory segment includes at least one memory cell in the first state; and
a controller configured to control programming and erasing of memory segments, wherein the controller is configured to:
map an external memory address of write data to an internal memory address of an erased memory segment such that the erased memory segment is programmed with the write data;
remap the external memory address to a second internal memory address of an erased memory segment in response to a write access for an external memory address previously mapped to a first internal memory address of a programmed memory segment; and
identify for erasure the programmed memory segment associated with the first internal memory address and control selective erasure of the identified programmed memory segment.

12. The system of claim 11, wherein the memory device comprises a memory module comprising a plurality of memory chips.

13. The system of claim 11, wherein the memory device comprises a memory chip.

* * * * *